(12) United States Patent
Terasaki et al.

(10) Patent No.: US 10,011,093 B2
(45) Date of Patent: *Jul. 3, 2018

(54) BONDING STRUCTURE OF ALUMINUM MEMBER AND COPPER MEMBER

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 327 days.

This patent is subject to a terminal disclaimer.

(21) Appl. No.: 14/428,776

(22) PCT Filed: Sep. 18, 2013

(86) PCT No.: PCT/JP2013/075158
§ 371 (c)(1),
(2) Date: Mar. 17, 2015

(87) PCT Pub. No.: WO2014/046130
PCT Pub. Date: Mar. 27, 2014

(65) Prior Publication Data
US 2015/0251382 A1    Sep. 10, 2015

(30) Foreign Application Priority Data

Sep. 21, 2012 (JP) ................. 2012-208578

(51) Int. Cl.
*B32B 15/01* (2006.01)
*B23K 20/02* (2006.01)
(Continued)

(52) U.S. Cl.
CPC ............ *B32B 15/017* (2013.01); *B23K 20/02* (2013.01); *B23K 20/2333* (2013.01);
(Continued)

(58) Field of Classification Search
CPC .... B23K 20/00; B23K 20/02; B23K 2203/12; H01L 23/12–23/14; H01L 23/36; B32B 15/017; Y10T 428/12667
(Continued)

(56) References Cited

U.S. PATENT DOCUMENTS 6,033,787 A    3/2000 Nagase et al.
6,124,635 A    9/2000 Kuwabara
(Continued)

FOREIGN PATENT DOCUMENTS

CN    101947689 A    1/2011
DE    102010041714 A1    8/2011
(Continued)

OTHER PUBLICATIONS

Ujimoto, machine translation of JPH06-292984, Oct. 21, 1994.*
(Continued)

*Primary Examiner* — David Sample
*Assistant Examiner* — Mary I Omori
(74) *Attorney, Agent, or Firm* — Locke Lord LLP

(57) ABSTRACT

A bonding structure of an aluminum member and a copper member includes: the aluminum member composed of aluminum or an aluminum alloy, and the copper member composed of copper or a copper alloy in which the aluminum member and the copper member are bonded together by solid phase diffusion bonding; an intermetallic compound layer that is made of copper and aluminum and is formed in a bonding interface between the aluminum member and the copper member; and an oxide dispersed in an interface between the copper member and the intermetallic compound layer in a layered form along the interface.

3 Claims, 10 Drawing Sheets

(51) Int. Cl.
    *B23K 20/233*     (2006.01)
    *H01L 23/36*     (2006.01)
    *B23K 101/36*     (2006.01)
    *B23K 103/10*     (2006.01)
    *B23K 103/12*     (2006.01)
    *H01L 23/433*     (2006.01)

(52) U.S. Cl.
    CPC .......... *H01L 23/36* (2013.01); *B23K 2201/36* (2013.01); *B23K 2203/10* (2013.01); *B23K 2203/12* (2013.01); *H01L 23/4334* (2013.01); *H01L 2924/0002* (2013.01); *Y10T 428/12667* (2015.01)

(58) Field of Classification Search
    USPC .................................................. 428/650, 640
    See application file for complete search history.

(56) References Cited

U.S. PATENT DOCUMENTS

| | | | |
|---|---|---|---|
| 6,310,775 B1 | 10/2001 | Nagatomo et al. | |
| 6,323,458 B1 | 11/2001 | Nomura et al. | |
| 6,921,583 B2 * | 7/2005 | Koyama | B23K 1/19 228/158 |
| 7,532,481 B2 | 5/2009 | Nagase et al. | |
| 8,116,084 B2 | 2/2012 | Kitahara et al. | |
| 8,159,821 B2 | 4/2012 | Tan et al. | |
| 8,883,318 B2 | 11/2014 | Yamamoto et al. | |
| 2002/0109152 A1 | 8/2002 | Kobayashi et al. | |
| 2006/0046035 A1 | 3/2006 | Tanaka et al. | |
| 2009/0174063 A1 | 7/2009 | Furukawa et al. | |
| 2010/0243458 A1 * | 9/2010 | Kojima | B29C 33/38 205/50 |
| 2012/0202090 A1 | 8/2012 | Yamamoto et al. | |
| 2012/0298408 A1 | 11/2012 | Nagatomo et al. | |
| 2013/0010429 A1 * | 1/2013 | Tonomura | H01L 23/3735 361/720 |
| 2013/0071686 A1 | 3/2013 | Oda et al. | |

FOREIGN PATENT DOCUMENTS

| | | |
|---|---|---|
| EP | 2833398 A1 | 2/2015 |
| JP | 04-315524 A | 11/1992 |
| JP | 06-292984 A | 10/1994 |
| JP | 8-255973 A | 10/1996 |
| JP | 11-156995 A | 6/1999 |
| JP | 2001-252772 A | 9/2001 |
| JP | 2002-064169 A | 2/2002 |
| JP | 2002-231865 A | 8/2002 |
| JP | 2003-078086 A | 3/2003 |
| JP | 2003-092383 A | 3/2003 |
| JP | 2003-258170 A | 9/2003 |
| JP | 2004-001069 A | 1/2004 |
| JP | 2004-288828 A | 10/2004 |
| JP | 2009-135392 A | 6/2009 |
| JP | 2009-224571 A | 10/2009 |
| JP | 2010-034238 A | 2/2010 |
| JP | 2010-137251 A | 6/2010 |
| JP | 2012-160642 A | 8/2012 |
| TW | 252061 B | 7/1995 |
| TW | 540298 B | 7/2003 |
| WO | 2011/030754 A1 | 3/2011 |
| WO | WO-2011/155379 A1 | 12/2011 |
| WO | WO-2013/147144 A1 | 10/2013 |
| WO | WO-2014/046130 A1 | 3/2014 |

OTHER PUBLICATIONS

Uehara, Fabrication of intermetallics micro networks on light metals for surface stress modifications through reaction diffusion joining, Oct. 16-20, 2011, Materual Science and Technology (MS&T) 2011 Conference, 1539-1545.*
Supplementary European Search Report dated May 9, 2016, issued for the European patent application No. 13839672.6.
Office Action dated May 26, 2016, issued for the Chinese patent application No. 201380048500.6 and English translation of Search Report.
International Search Report dated Nov. 19, 2013, issued for PCT/JP2013/075158 and English translation thereof.
Notice of Allowance dated Apr. 25, 2014, issued for the Japanese patent application No. 2013-193431 and English translation thereof.
Office Action dated Aug. 2, 2016, issued for Taiwanese patent application No. 102133870 and English translation of Search Report.
International Search Report dated Dec. 17, 2013, issued for PCT/JP2013/077766 and English translation thereof.
Office Action dated May 20, 2014, issued for the Japanese patent application No. 2013-214070 English translation thereof.
Notice of Allowance dated Aug. 12, 2014, issued for the Japanese patent application No. 2013-214070 and English translation thereof.
Search Report dated May 20, 2016, issued for the European patent application No. 13847976.1.
Office Action dated May 2, 2016, issued for U.S. Appl. No. 14/435,554.
Final Office Action dated Oct. 24, 2016, issued for U.S. Appl. No. 14/435,554.

* cited by examiner

BONDING STRUCTURE OF ALUMINUM MEMBER AND COPPER MEMBER

TECHNICAL FIELD

The present invention relates to a bonding structure of an aluminum member composed of aluminum or an aluminum alloy and a copper member composed of copper or a copper alloy.

Priority is claimed on Japanese Patent Application No. 2012-208578, filed Sep. 21, 2012, the contents of which are incorporated herein by reference.

BACKGROUND ART

Since both of the above aluminum member and copper member are excellent in electrical conductivity and thermal conductivity, they are widely used for electrical and electronic parts, heat radiation parts, and the like.

Here, the copper member is excellent particularly in heat conductivity and has properties of high mechanical strength and large deformation resistance. On the other hand, the aluminum member is slightly inferior to copper in electrical conductivity and thermal conductivity, but the aluminum member has properties such as lightweight and a low deformation resistance.

Accordingly, in the electrical and electronic parts, heat radiation parts, and the like, depending on the required performance, the copper member and aluminum member are selectively used. Recently, from the viewpoint of size and weight of the electrical and electronic parts and heat radiation parts described above, there is a need for a bonding body in which the copper member and the aluminum member are bonded together.

Aluminum and copper, as shown in a phase diagram of FIG. 1, is known to produce various forms of intermetallic compounds, and when an aluminum member and a copper member are directly welded, these intermetallic compounds are produced in large amount and randomly in the bonding interface between the aluminum member and the copper member. Since these intermetallic compounds are very brittle compared to the copper member and aluminum member, the bonding interface between the copper member and the aluminum member becomes brittle locally, and bonding reliability between the copper member and the aluminum member could not be sufficiently secured.

As a method of bonding an aluminum member and a copper member, a friction welding method, a diffusion bonding method and the like, have been proposed. Also, for example, in Patent Documents 1 to 3, a method of bonding an aluminum member and a copper member together while suppressing the generation of intermetallic compounds has been proposed.

Diffusion bonding method is a method in which a heat treatment is carried out at a temperature of a melting temperature or lower after bonding the copper member and the aluminum member together in advance by drawing or pack rolling the copper member and the aluminum member.

In addition, a friction welding method is a method in which while the copper member and the aluminum member are pressed to each other, a friction of the copper member with the aluminum member is performed and they are bonding by the frictional heat and pressure.

Patent Document 1 discloses that a rod shaped aluminum member is inserted inside a tube shaped copper member, and then, a clad material in which the copper member and the aluminum member are bonded with a metallic bond is produced by performing drawing machining.

Patent Document 2 discloses that an insert material made of pure aluminum or the like is bonded to a copper member by cold rolling, an aluminum member is bonded to the insert material by hot rolling or cold rolling, and a heat treatment is carried out after the insert material is bonded to the copper member.

Furthermore, Patent Document 3 proposes a method in which a metal layer made of Ag is formed on a bonding surface of a copper member, and the metal layer and an aluminum layer are brazed.

PRIOR ART DOCUMENTS

Patent Documents

[Patent Document 1] Japanese Unexamined Patent Application, First Publication No. H04-315524
[Patent Document 2] Japanese Unexamined Patent Application, First Publication No. 2001-252772
[Patent Document 3] Japanese Unexamined Patent Application, First Publication No. 2004-001069

DISCLOSURE OF THE INVENTION

Problems to be Solved by the Invention

In the conventional diffusion bonding method and the friction welding method, and the bonding methods shown in Patent Documents 1 and 2, relatively large machining facilities are necessary in order to bond the copper member and the aluminum member together using an action of a large shear force at the bonding interface between the copper member and the aluminum member. Therefore, the aluminum member and the copper member could not be bonded easily and reliably.

In addition, since the large shear force at the bonding interface between the copper member and the aluminum member is allowed to act, the area in the vicinity of the bonding interface tends to become unstable and the characteristics of the area in the vicinity of the bonding interface cannot be stabilized. Furthermore, since an oxide film is formed on a surface of the aluminum member, the oxide film will be dispersed randomly in the area in the vicinity of the bonding interface by the large shear force, and therefore, there is a possibility that the characteristics of the area in the vicinity of the bonding interface is unstable.

In addition, in the method described in Patent Document 3, since an Ag layer is interposed between the copper member and the aluminum member, there is a region having different characteristics with the copper member and aluminum member in the area in the vicinity of the bonding interface. Also, since the copper member and the Ag layer are bonded together by cold rolling, relatively large machining facilities are necessary, and therefore bonding could not be carried out easily.

The present invention has been made in view of the above circumstances, and the purpose thereof is to provide a bonding structure of an aluminum member and a copper member in which the aluminum member made of aluminum or an aluminum alloy and the copper member made of copper or a copper alloy are bonded together relatively easily and reliably and the bonding structure thereof has sufficient bonding reliability and can be applied to electrical and electronic parts, and heat radiation parts.

Means for Solving the Problem (1) A bonding structure of an aluminum member and a copper member according to an aspect of the present invention includes: the aluminum member composed of one of aluminum and an aluminum alloy, and the copper member composed of one of copper and a copper alloy in which the aluminum member and the copper member are bonded together by solid phase diffusion bonding; an intermetallic compound layer that is made of copper and aluminum and is formed in an bonding interface between the aluminum member and the copper member; and an oxide dispersed in an interface between the copper member and the intermetallic compound layer in a layered form along the interface.

In the bonding structure of the aluminum member and the copper member of this configuration, since the aluminum member and the copper member composed of copper or a copper alloy are bonded together by solid phase diffusion and the intermetallic compound layer made of copper and aluminum is formed in the bonding interface between the aluminum member and the copper member, Cu (copper) in the copper member and Al (aluminum) in the aluminum member interdiffuse sufficiently, and the aluminum member and the copper member are bonded firmly together.

In addition, in the interface between the copper member and the intermetallic compound layer, since the oxide is dispersed in a layered form along the interface, the oxide film formed on the surface of the aluminum member is broken and solid phase diffusion bonding progresses sufficiently.

(2) The bonding structure of the aluminum member and the copper member according to another aspect of the present invention is the bonding structure described in (1), wherein an average crystal grain size of the copper member is in a range of 50 μm to 200 μm, and an average crystal grain size of the aluminum member is 500 μm or more.

In this case, the average crystal grain size of the copper member is in a range of 50 μm to 200 μm and the average crystal grain size of the aluminum member is 500 μm or more, and thus, the average crystal grain sizes of the copper member and aluminum member are relatively large. That is, since severe plastic deformation such as rolling is not carried out when solid phase diffusion bonding is carried out, an excessive distortion or the like is not accumulated in the copper member and the aluminum member. Therefore, it is possible to improve fatigue properties of the copper member and the aluminum member.

(3) The bonding structure of the aluminum member and the copper member according to another aspect of the present invention is the bonding structure described in (1) or (2), wherein the intermetallic compound layer has a structure in which a plurality of intermetallic compounds is laminated along the bonding interface.

In this case, the intermetallic compounds, which are brittle, are prevented from growing large. Also, since the intermetallic compounds are formed in a layered form so as to be suitable for each composition from the copper member toward the aluminum member by the interdiffusion of Cu in the copper member and Al in the aluminum member, the properties of the area in the vicinity of the bonding interface are stable.

(4) The bonding structure of the aluminum member and the copper member according to another aspect of the present invention is the bonding structure described in (3), wherein the intermetallic compound layer has a structure in which at least a η2 phase, a ζ2 phase, and a θ phase are laminated along the bonding interface.

(5) The bonding structure of the aluminum member and the copper member according to another aspect of the present invention is the bonding structure described in (3), wherein the intermetallic compound layer has a structure in which the θ phase and η2 phase are laminated and furthermore, at least one phase from the ζ2 phase, an δ phase, and a γ2 phase is laminated, and wherein the θ phase and η2 phase and at least one phase from the ζ2 phase, the δ phase, and the γ2 phase are laminated sequentially from the aluminum member toward the copper member along the bonding interface.

In this case, since the intermetallic compounds are formed in a layered form so as to be suitable for each composition from the copper member toward the aluminum member by the interdiffusion of Cu in the copper member and Al in the aluminum member, the volume change in an inside of the intermetallic compound layer becomes small, an internal distortion thereof is suppressed, and the bonding strength thereof can be secured sufficiently.

Effects of the Invention

The present invention can provide a bonding structure of an aluminum member and a copper member in which the aluminum member made of aluminum or an aluminum alloy and the copper member made of copper or a copper alloy are bonded together relatively easily and reliably, the bonding structure thereof has sufficient bonding reliability and can apply to electrical and electronic parts and heat radiation parts, and a production method thereof.

EMBODIMENTS OF THE INVENTION

Figure 1:
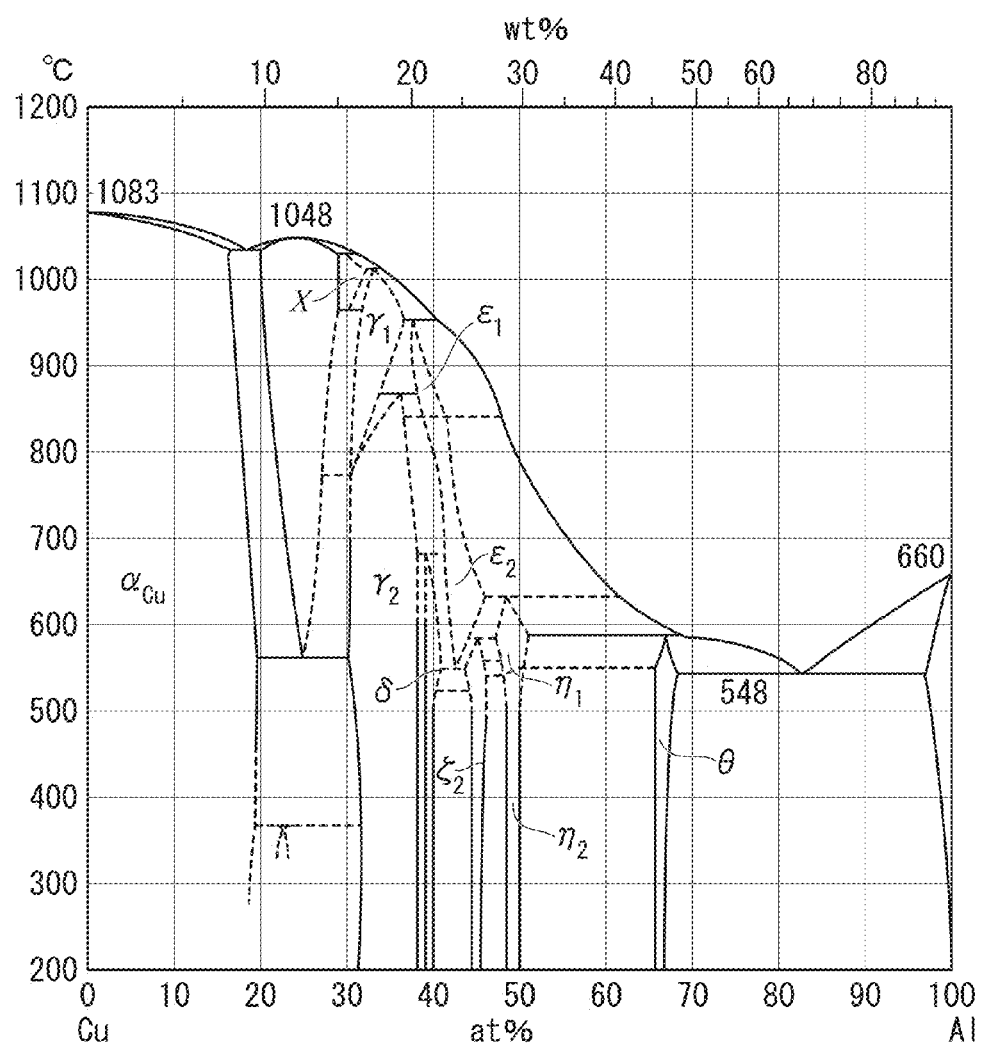
FIG. 1 is a binary phase diagram of Cu and Al.
Figure 2:
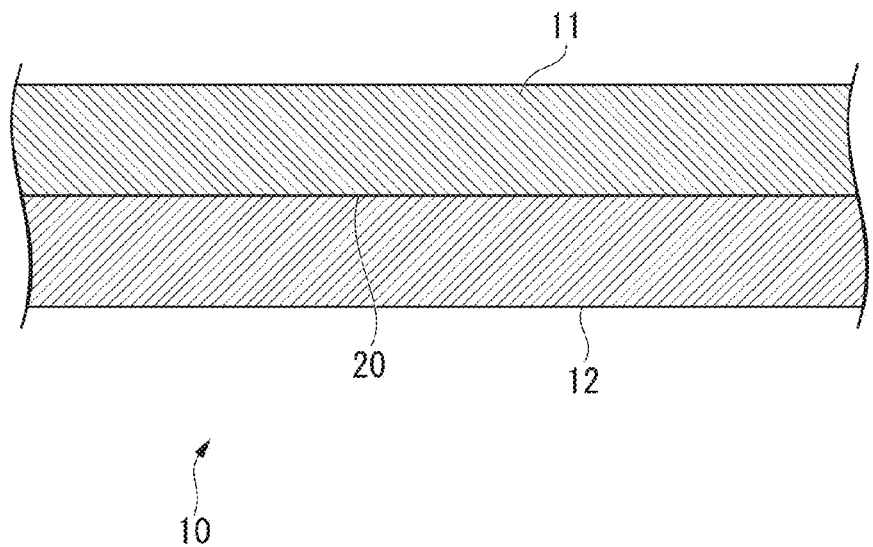
FIG. 2 is a schematic explanatory diagram of a lamination plate having a bonding structure of an aluminum member and a copper member according to an embodiment of the present invention.

A bonding structure of an aluminum member and a copper member according to an embodiment of the present invention will be explained with reference to the accompanying drawings. A lamination plate 10 having the bonding structure of the aluminum member and the copper member according to an embodiment of the present invention is shown in FIG. 2.

The lamination plate 10 is configured by laminating an aluminum plate 11 (aluminum member) composed of aluminum or an aluminum alloy to a surface (a first surface) of a copper plate 12 (copper member) composed of copper or a copper alloy and bonding them. In the present embodiment, the aluminum plate 11 is a rolled sheet of a pure aluminum (4N aluminum) having a purity of 99.99% or more, and the copper plate 12 is a rolled sheet of an oxygen-free copper.

The lamination plate 10 is widely used for, for example, electrical and electronic parts, heat radiation parts and the like. In the present embodiment, it is used for a heat sink which is one of heat-transfer members in which fins are provided on a second surface of the aluminum plate 11. A first surface of the aluminum plate 11 is bonded to the copper plate 12, and the second surface of the aluminum plate 11 is an opposite surface to the first surface of the aluminum plate 11.

Figure 3:
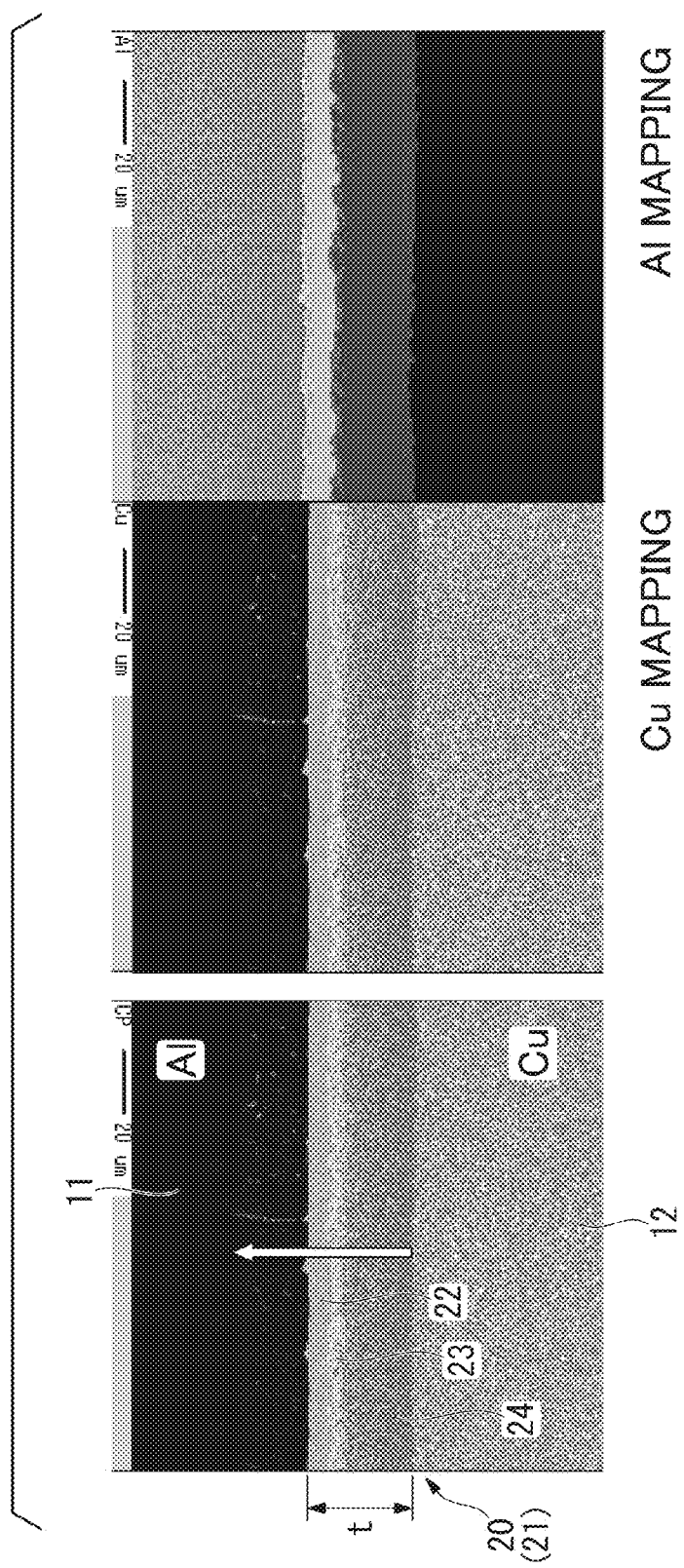
FIG. 3 is electron microscope observation pictures of a bonding interface between the bonding structure of the aluminum member and the copper member, and mapping drawings of Cu atoms and Al atoms. The pictures and drawings show the embodiment of the present invention.

Here, as shown in electron microscope observation pictures shown in FIG. 3, a bonding portion 20 is formed between the aluminum plate 11 and the copper plate 12. The bonding portion 20 includes an intermetallic compound layer 21 made of Cu and Al, and in the present embodiment, it has a structure in which a plurality of intermetallic compounds is laminated along a bonding interface of the aluminum plate 11 and the copper plate 12. Here, the thickness t of the intermetallic compound layer 21 is set to be in a range of 1 to 80 μm, and preferably be in a range of 5 to 80 μm.

The bonding portion 20 (intermetallic compound layer 21) is configured so that three types of intermetallic compounds 22, 23, and 24 are laminated, as shown in the electron microscope observation pictures and mapping drawings of Cu atoms and Al atoms of FIG. 3.

The three types of the intermetallic compounds 22, 23, and 24 are arranged in order of a θ phase 22, a η2 phase 23, and a ζ2 phase 24 from the aluminum plate 11 toward the copper plate 12.

Figure 4:
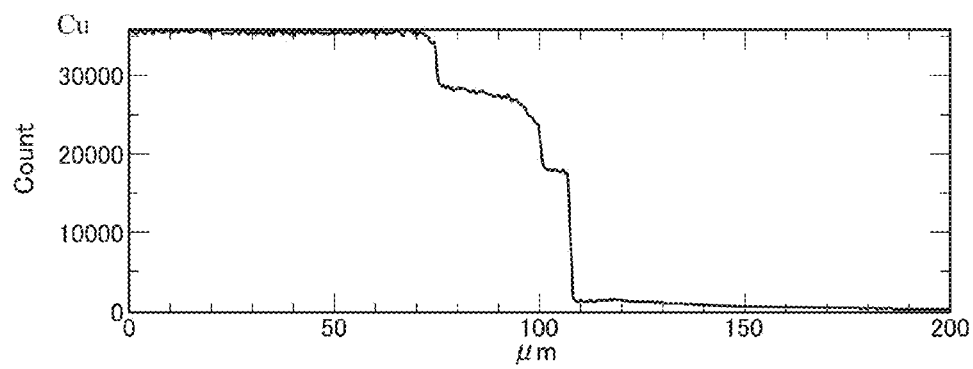
FIG. 4 is a graph showing line analysis results of Cu at a position shown in FIG. 3.
Figure 5:
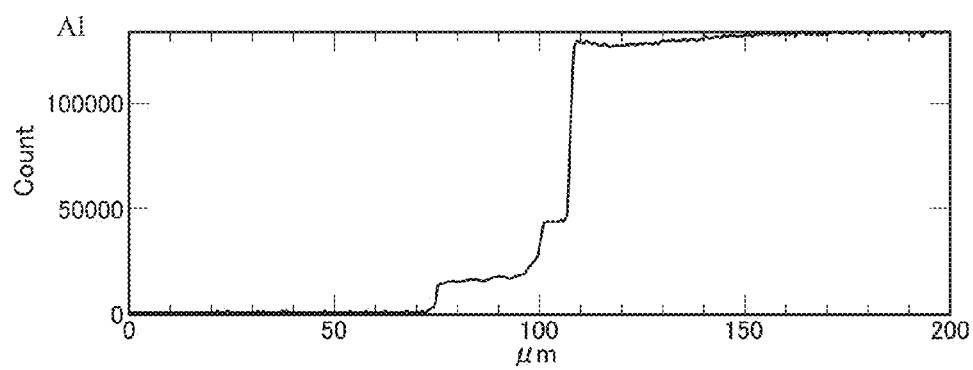
FIG. 5 is a graph showing line analysis results of Al at a position shown in FIG. 3.

According to the line analysis results of Cu shown in FIG. 4 and the line analysis results of Al shown in FIG. 5, the results show that Cu and Al analysis values change in step-wise and the plurality of the intermetallic compounds is laminated. In addition, since the η2 phase 23 and ζ2 phase 24 are similar in a component ratio of Cu and Al, they cannot be clearly distinguished by the line analysis results of FIGS. 4 and 5.

Figure 6:
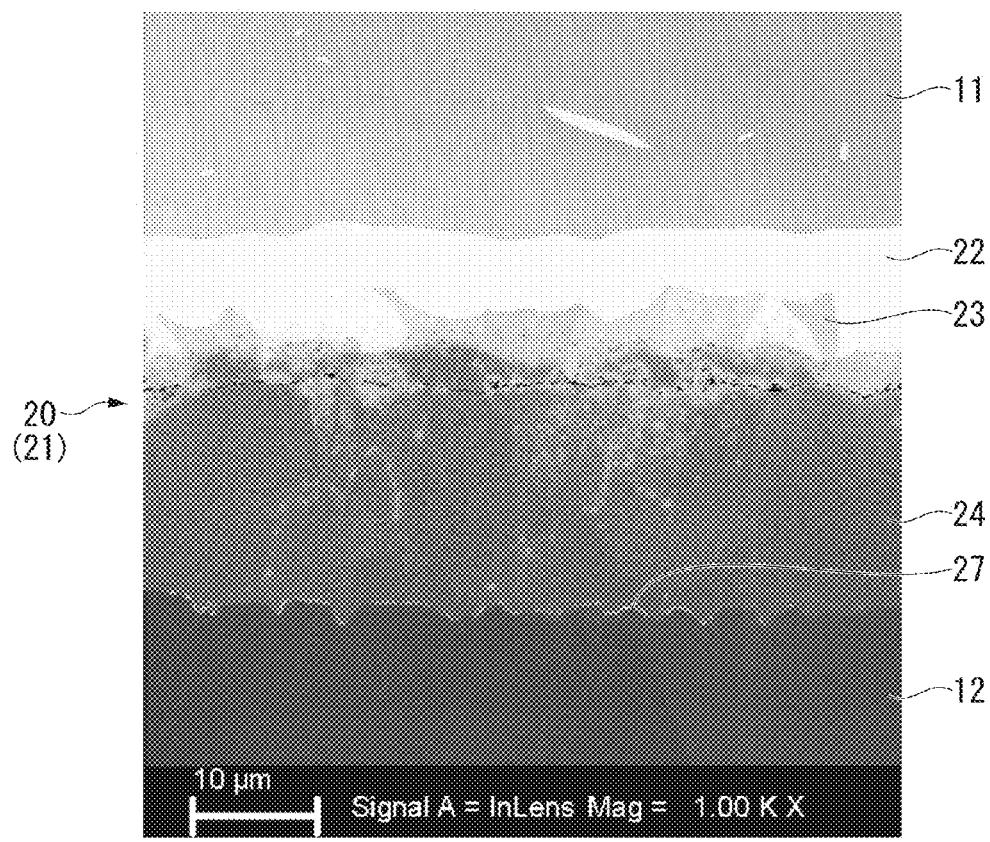
FIG. 6 is an electron microscope observation picture of the bonding interface of the bonding structure of the aluminum member and copper member.
Figure 7:
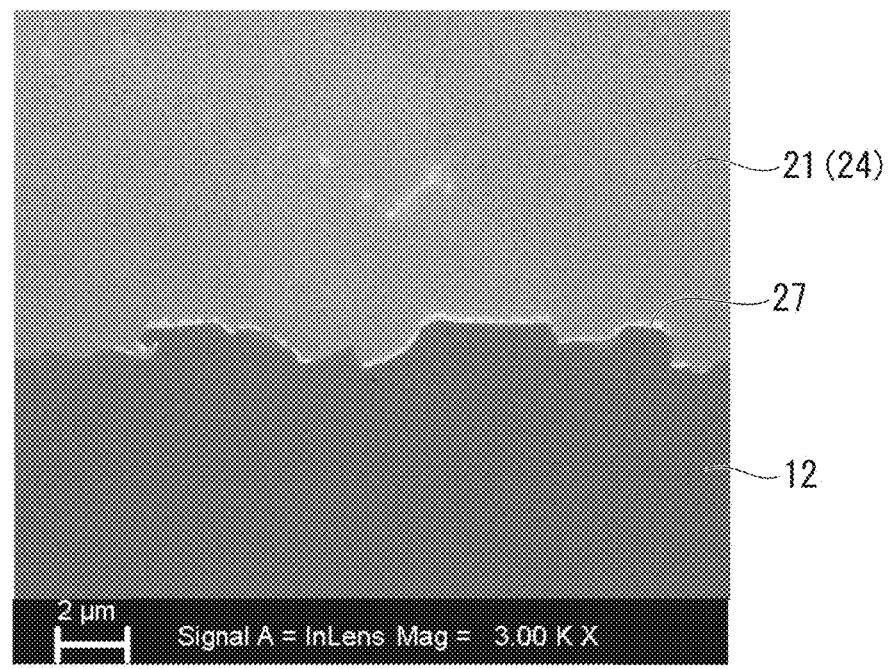
FIG. 7 is an enlarged picture of an interface between the copper plate and an intermetallic compound layer in FIG. 6.

Here, as shown in the electron microscope observation picture and enlarged picture in FIGS. 6 and 7, in the bonding portion 20, an oxide 27 is dispersed in an interface between the copper plate 12 and the intermetallic compound layer 21 in a layered form along the interface. In addition, in the present embodiment, the oxide 27 is an aluminum oxide such as alumina ($Al_2O_3$). In addition, the oxide 27 is dispersed in a state of being divided in the interface between the copper plate 12 and the intermetallic compound layer 21, and the copper plate 12 and the intermetallic compound layer 21 are directly in contact in some regions.

Furthermore, in the present embodiment, in the area in the vicinity of the bonding portion 20, the average crystal grain size of the aluminum member 11 is 500 μm or more and the average crystal grain size of the copper plate 12 is in a range of 50 μm to 200 μm.

Figure 8:
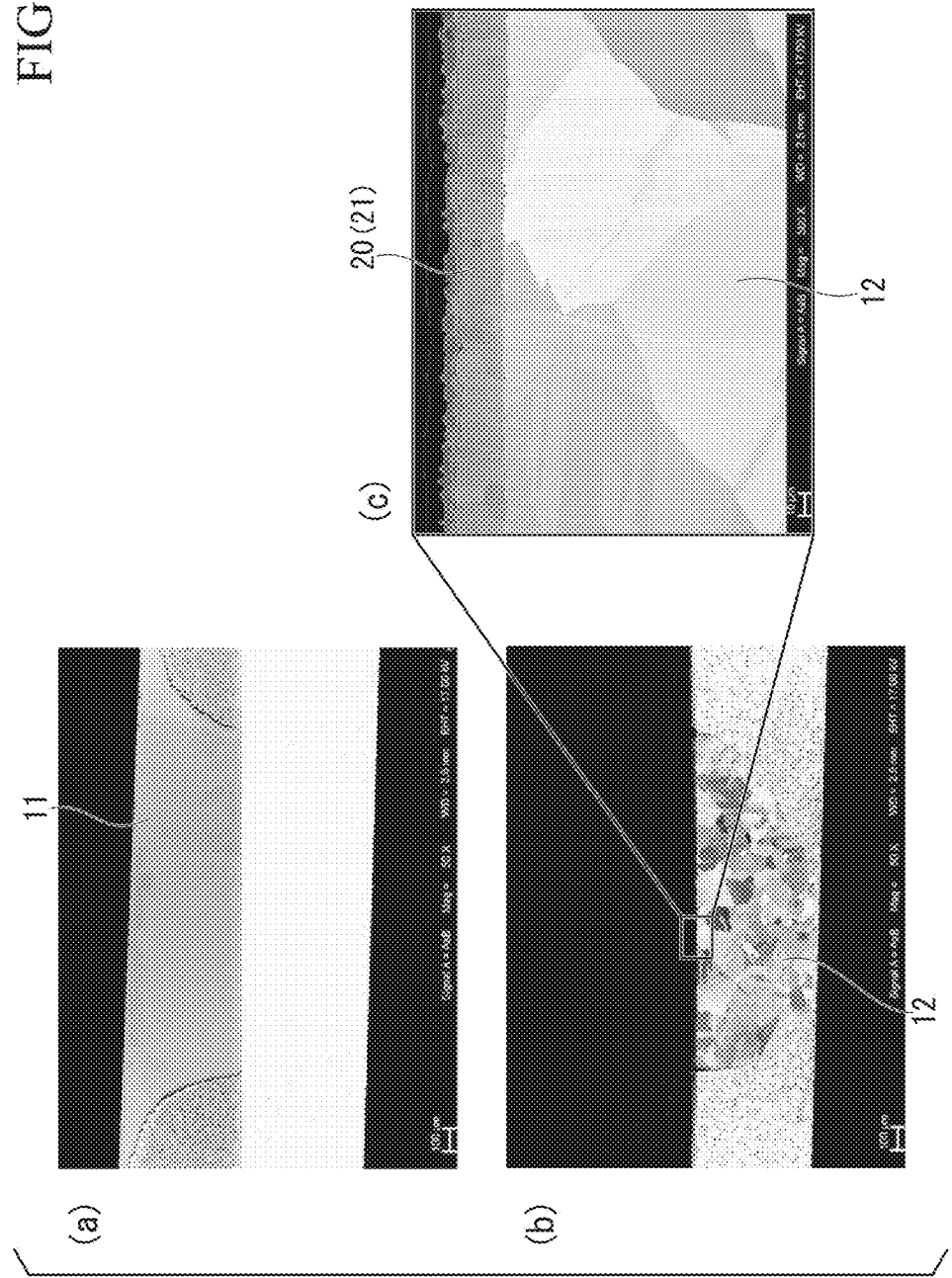
FIG. 8 is AsB images of the area in the vicinity of the bonding interface in the bonding structure of the aluminum member and the copper member which is the embodiment of the present invention.

AsB images (Angle Selective (very-low-angle) Scattered and Reflected electron images) of the area in the vicinity of the bonding portion 20 are shown in FIG. 8. In addition, in FIG. 8(a), since observation conditions are set to observe the aluminum member 11, the copper plate 12 is shown in white. Also, in FIGS. 8(b) and (c), since observation conditions are set to observe the copper plate 12, the aluminum member 11 is shown in black. In FIGS. 8(a) and (b), a crystalline structure of a part in which ion etch was performed is observed.

From these AsB images (Angle Selective (very-low-angle) Scattered and Reflected electron images), the average crystal grain size of the aluminum member 11 and the average crystal grain size of the copper plate 12 can be measured.

In addition, the AsB images were photographed by using a Scanning electron microscope (ULTRA55 produced by Carl Zeiss NTS GmbH) with an accelerating voltage: 17 kV and a WD: 2.4 mm.

Figure 9:
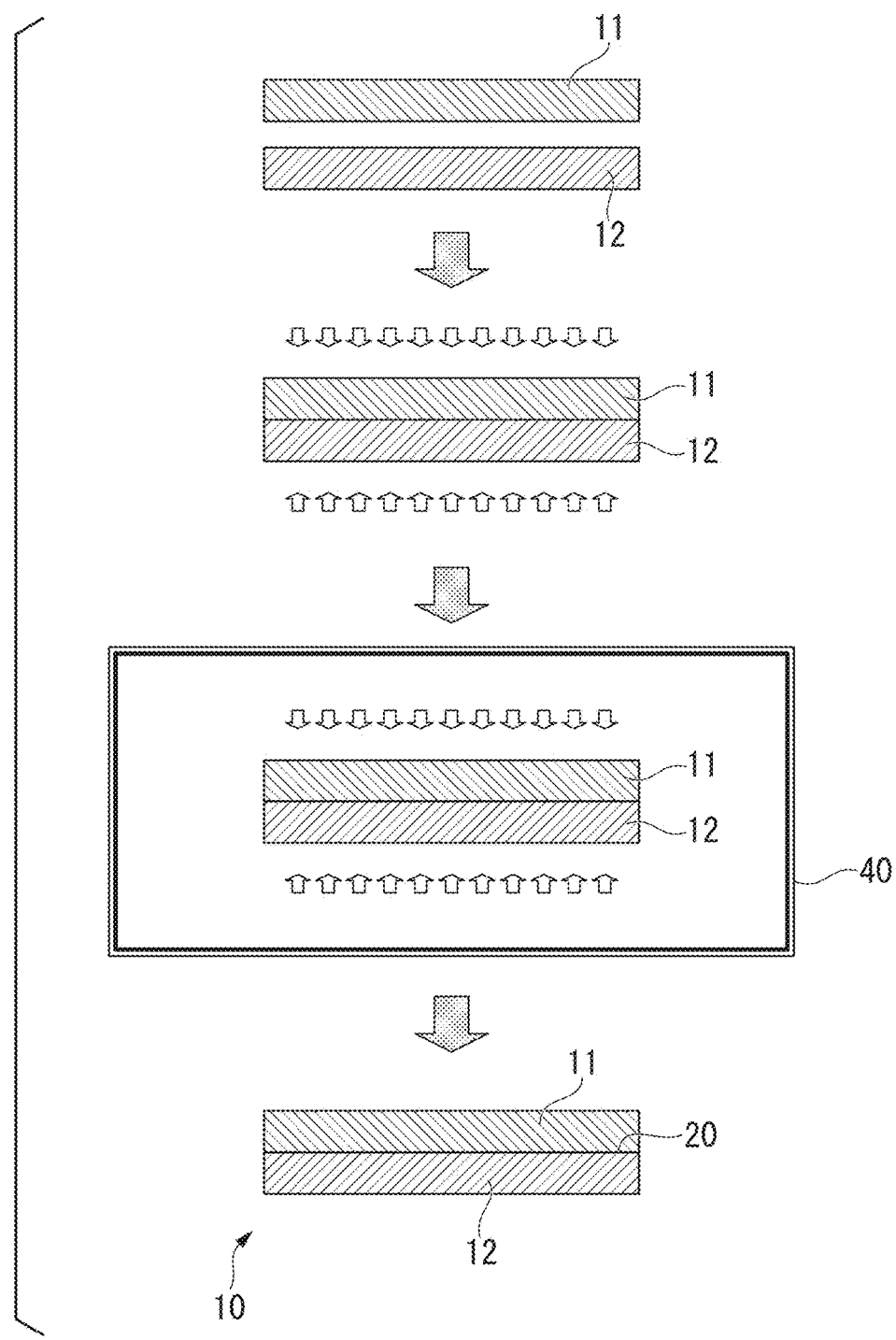
FIG. 9 is an explanatory diagram showing a production method of the lamination plate having the bonding structure of the aluminum member and the copper member which is the embodiment of the present invention.

A production method of the lamination plate 10 will be explained with reference to FIG. 9.

First, the aluminum plate 11 is laminated on a surface of the copper plate 12. At this time, in a case in which there is irregularity such as scratches on the surfaces of the aluminum plate 11 and the copper plate 12 which will be bonded together, a gap is generated therebetween when they are laminated. Therefore, the surfaces which will be bonded together are preferably formed so as to have smooth surfaces by polishing or the like, in advance.

Figure 13:
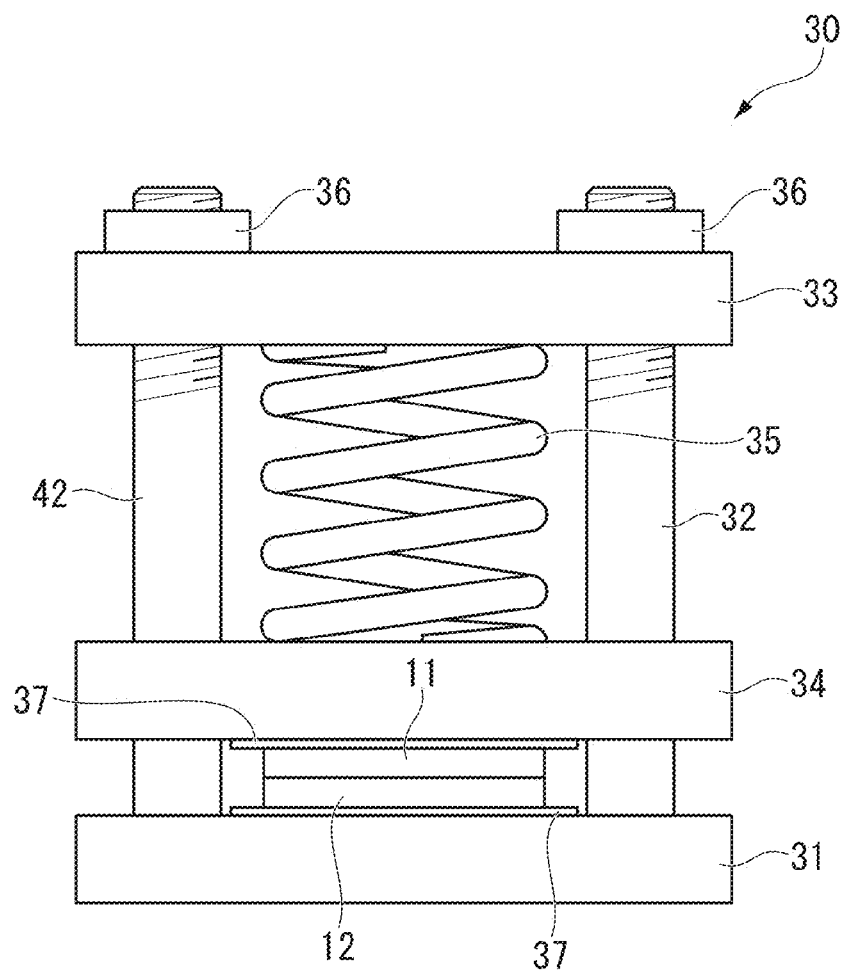
FIG. 13 is an explanatory diagram showing a pressure device used for the production method of the lamination plate having the bonding structure of the aluminum member and the copper member according to the embodiment of the present invention.

Next, the copper plate 12 and the aluminum plate 11 are pressed in a lamination direction by using a pressure device 30 shown in FIG. 13. The load at this time is 3 kgf/cm$^2$ to 35 kgf/cm$^2$.

The pressure device 30 includes a base plate 31, guide posts 32, a fixed plate 33, a pressing plate 34, a biasing device 35, and an adjusting screw 36. The guide posts 32 are mounted vertically at four corners of the upper surface of the base plate 31. The fixed plate 33 is disposed on the upper end portion of these guide posts 32. The pressing plate 34 is supported by the guide posts 32 vertically movable between the fixed plate 33 and the base plate 31. The biasing device 35 is a spring or the like adding a force to the pressing plate 34 downward and is provided between the fixed plate 33 and the pressing plate 34. The adjustment screw 36 is able to raise and lower the fixed plate 33.

The fixed plate 33 and the pressing plate 34 are disposed parallel to the base plate 31, and the aluminum plate 11 and the copper plate 12 are disposed between the base plate 31 and the pressing plate 34. Here, a carbon sheet 37 is interposed between the aluminum plate 11 and the pressing plate 34, and another carbon sheet 37 is interposed between and the copper plate 12 the base plate 31.

Then, the fixing plate 33 is raised or lowered by adjusting the position of the adjustment screw 36, and the pressing plate 34 is pushed into the base plate 31-side by the biasing device 35, and the aluminum plate 11 and the copper plate 12 are pressed in the lamination direction thereby.

Then, with maintaining the pressing state, it is charged into the vacuum heating furnace 40. At this time, the heating temperature is set within a range of 400° C. or more to less than 548° C. and the retention time is set within a range of 5 to 240 minutes. The heating temperature is more preferably in a range of 543° C. (5° C. less than the eutectic temperature of Cu and Al) or more to less than 548° C. (the eutectic temperature of Cu and Al).

By heating in a state of pressing in the lamination direction as described above, Al in the aluminum plate 11 diffuses into the copper plate 12 side, Cu in the copper plate 12 is diffused into the aluminum plate 11 side. In addition, since the heating temperature is 400° C. or more to less than 548° C. and is set lower than the eutectic temperature of Cu and Al, a liquid phase is not generated, and therefore, the diffusion proceeds in a solid phase state. Further, in the present embodiment, the aluminum plate 11 and the copper plate 12 are merely pressed to the lamination direction, and a shearing force is not allowed to act in the bonding surface between the aluminum plate 11 and the copper plate 12.

In this manner, a lamination plate 10 having a bonding portion 20 in which a plurality of intermetallic compounds is laminated along the bonding interface is produced.

In the lamination plate 10 of the present embodiment having the above-described configuration, since an intermetallic compound layer 21 made of Cu and Al is formed between the aluminum plate 11 and the copper plate 12, Al in the aluminum plate 11 is sufficiently diffused into the copper plate 12 side and Cu in the copper plate 12 is sufficiently diffused into the aluminum plate 11 side (Al and Cu interdiffuse sufficiently), and the aluminum plate 11 and the copper plate 12 are reliably bonded together by solid phase diffusion bonding, and the bonding strength can be secured.

In addition, in the interface between the copper plate 12 and the intermetallic compound layer 21, since the oxide 27 is dispersed in a layered form along the interface, an oxide film formed on a surface of the aluminum plate 11 and an oxide film formed on a surface of the copper plate 12 are reliably broken, the interdiffusion of Cu and Al has progressed sufficiently, and the aluminum plate 11 and the copper plate 12 are securely bonded.

In addition, in the present embodiment, since the intermetallic compound layer 21 has a structure in which the plurality of intermetallic compounds is laminated along the bonding interface, the intermetallic compound layer 21, which is brittle, are prevented from growing large. Also, since the intermetallic compounds are formed in a layered form so as to be suitable for each composition from the copper plate 12 toward the aluminum plate 11 by the interdiffusion of Cu in the copper plate 12 and Al in the aluminum plate 11, the properties of the bonding portion 20 can be stable.

Specifically, since the intermetallic compound layer 21 is configured so that three types of the intermetallic compounds, which are a θ phase 22, a η2 phase 23, and ζ2 phase 24, are laminated sequentially from the aluminum plate 11 toward the copper plate 12, the volume change inside the intermetallic compound layer 21 becomes small, and an internal distortion of the intermetallic compound layer 21 is suppressed. That is, if solid diffusion does not occur, for example, if a liquid phase is formed, the intermetallic compounds are generated more than necessary and the volume change of the intermetallic compound layer becomes large, and thus, an internal distortion of the intermetallic compound layer occurs. However, if solid diffusion is occurred, the brittle intermetallic compound layer does not grow large and the intermetallic compounds are formed in a layered form, and therefore, the internal distortion thereof can be limited.

Furthermore, in the present embodiment, the average crystal grain size of the aluminum member 11 is 500 μm or more and the average crystal grain size of the copper plate 12 is in a range of 50 μm to 200 μm, and thus, the average crystal grain sizes of the aluminum member 11 and the copper plate 12 are set to be relatively large.

Accordingly, an excessive distortion or the like is not accumulated in the aluminum member 11 and the copper plate 12, and therefore, it is possible to improve the fatigue properties of the lamination plate 10.

Moreover, in the present embodiment, the average thickness of the intermetallic compound layer 21 is in a range of 1 μm to 80 μm, and more preferably is in a range of 5 μm to 80 μm. Thus, the interdiffusion of Cu and Al progresses sufficiently, the aluminum plate 11 and the copper plate 12 are bonded together firmly, the intermetallic compound layer 21, which is brittle compared to the aluminum plate 11 and the copper plate 12, is suppressed from growing more than necessary, and the properties of the bonding portion 20 become stable.

Further, in the present embodiment, when solid phase diffusion bonding is carried out by heating in the vacuum furnace 40, since the aluminum plate 11 and the copper plate 12 are pressed in the lamination direction and a load at the time of pressing is set to 3 kgf/cm² or more, an oxide film on the surface of the aluminum sheet 11 and an oxide film on the surface of the copper plate 12 are broken reliably and the interdiffusion of Cu and Al can be progressed sufficiently. Further, since the load at the time of pressing is set to 35 kgf/cm² or less, a deformation and the like of the aluminum plate 11 and the copper plate 12 can be suppressed, there is no need to use a large pressure device or the like, and the aluminum plate 11 and the copper plate 12 can be bonded together relatively easily.

In addition, in the present embodiment, since the temperature is 400° C. or more when heating is carried out using the vacuum furnace 40, the diffusion rate of Al and Cu can be secured and the interdiffusion of Cu and Al can be progressed sufficiently. Additionally, since the temperature is less than 548° C. when heating is carried out using the vacuum furnace 40, the generation of the liquid phase at the bonding interface can be suppressed, the excessive generation of the intermetallic compounds can be prevented, and the bonding portion 20 having a structure in which the plurality of intermetallic compounds is laminated along the bonding surface can be formed. In addition, since the temperature is 543° C. (5° C. less than the eutectic temperature of Cu and Al) or more when heating is carried out using the vacuum furnace 40, a sufficient diffusion rate can be secured and the bonding time can be greatly reduced.

Furthermore, since a retention time is set to 5 minutes or more when heating is carried out using the vacuum furnace 40, the interdiffusion of Cu and Al can be progressed sufficiently. In addition, since a retention time is set to 240 minutes or less when heating is carried out using the vacuum furnace 40, heat degradation of the aluminum plate 11 and the copper plate 12 can be prevented and the production cost of the lamination plate 10 can be reduced.

In addition, in the present embodiment, since the surfaces of the aluminum plate 11 and the copper plate 12 which will be bonded together are formed so as to have smooth surfaces by, for example, polishing out scratches or the like in advance, the generation of a gap therebetween can be suppressed when the aluminum plate 11 and the copper plate 12 are laminated, the aluminum plate 11 is arranged in close contact with the copper plate 12 and Al and Cu can inter-diffuse in the whole bonding surface, and the aluminum plate 11 and the copper plate 12 can be bonded together securely.

The embodiment of the present invention has been explained as above. However, the present invention is not limited thereto and can be appropriately changed without departing from the technical concept of the present invention.

For example, a lamination plate used for a heat sink which is one of heat-transfer members has been explained as an example; however, the lamination plate is not limited thereto, and it can be a member used for other uses of electronics and electrical parts or the like.

In addition, a lamination plate which an aluminum plate and a copper plate are bonded together has been explained as an example; however, the lamination plate is not limited thereto, it can be a member which has other shape and in which an aluminum plate and a copper plate are bonded together.

For example, it can be a member which an aluminum tube and a copper tube are bonded together. In this case, heating is preferable to carry out by pressing from an inner circumferential of a tube body arranged inside of the other tube body and an outer circumferential of the other tube body arranged outside of the tube body (pressing in a lamination direction of an aluminum member and a copper member).

Figure 10:
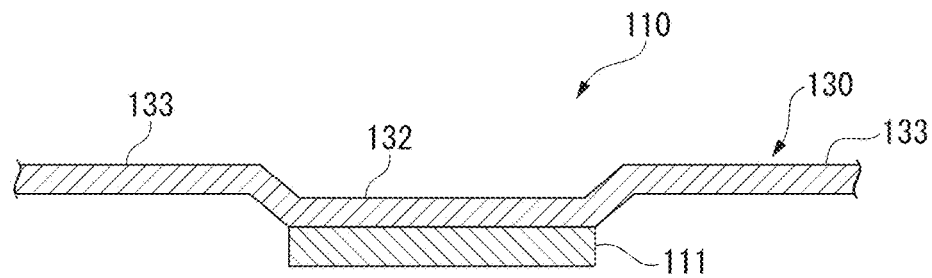
FIG. 10 is a schematic explanatory diagram of a lamination plate having a bonding structure of an aluminum member and a copper member according to another embodiment of the present invention.

For example, as shown in FIG. 10, as a copper plate 130, a member including a die pad 132 to which a semiconductor element or the like is bonded, and a lead portion 133 used as an external terminal can be used. In a lamination plate 110 shown in FIG. 10, the die pad 132 using the copper plate 130 is bonded to a surface of aluminum plate 111.

The thickness of the die pad 132 is set to be in a range of 0.1 to 6.0 mm. Also, the thickness of the aluminum plate 111 is set to be in a range of 0.1 to 1.0 mm.

The present embodiment has been explained such that the bonding portion 20 of the aluminum plate 11 and the copper plate 12 is configured so as to be laminated in order of the θ phase 22, the η2 phase 23, and the ζ2 phase 24 from the aluminum plate 11 toward the copper plate 12; however, the present embodiment is not limited thereto.

Figure 11:
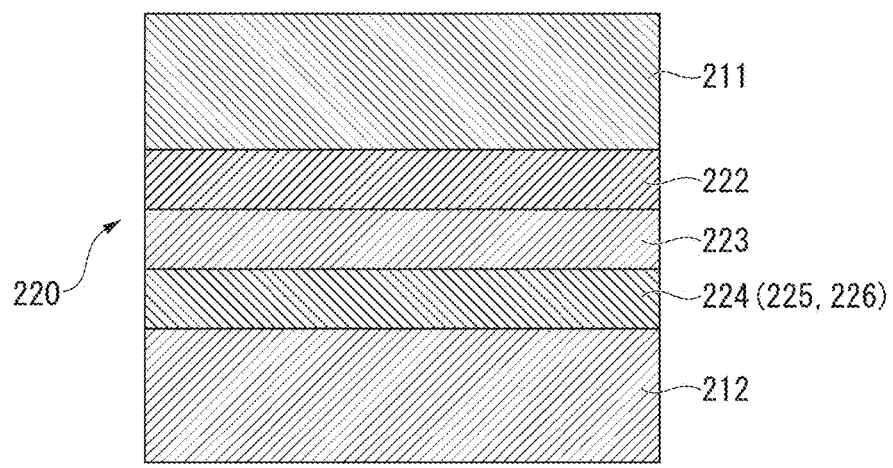
FIG. 11 is a schematic explanatory diagram of a bonding interface in the bonding structure of the aluminum member and the copper member according to still another embodiment of the present invention.

For example, as shown in FIG. 11, a bonding portion 220 of an aluminum plate 211 and a copper plate 212 can be configured so that a θ phase 222 and a η2 phase 223 are laminated in order from the aluminum plate 211 toward the copper plate 212 along a bonding interface between the aluminum plate 211 and the copper plate 212, and furthermore so that at least one phase from a ζ2 phase 224, an δ phase 225, and a γ2 phase 226 is laminated.

Figure 12:
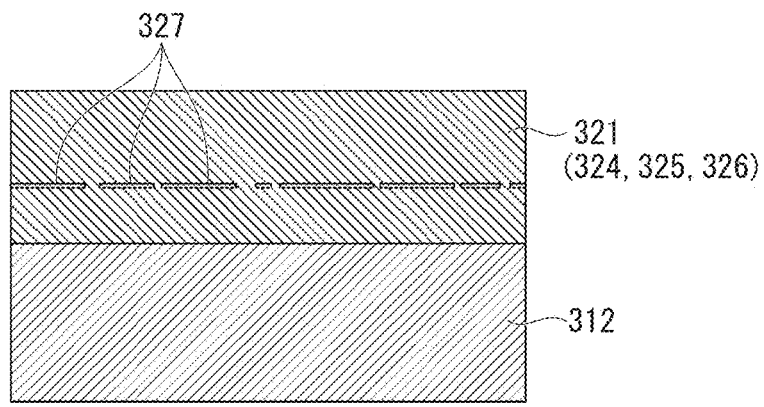
FIG. 12 is an enlarged view of an interface between the copper plate and an intermetallic compound layer in FIG. 11.

The present embodiment has been explained such that the bonding portion 20 is configured so that the oxide 27 is dispersed in a layered form along the interface in the interface between the copper plate 12 and the intermetallic compound layer 21. However, as shown in FIG. 12, along an interface between a copper plate 312 and an intermetallic compound layer 321, the bonding portion 20 can be configured so that an oxide 327 is dispersed in a layered form inside a layer configured of at least one phase from the ζ2 phase 324, the δ phase 325, and the γ2 phase 326. In addition, this oxide 327 is an aluminum oxide such as alumina ($Al_2O_3$).

Furthermore, the present embodiment has been explained such that the member is configured by bonding together the aluminum plate composed of pure aluminum having a purity of 99.99% and the copper plate composed of an oxygen-free copper. However, it is not limited thereto. A member can be configured by bonding together an aluminum member composed of aluminum or an aluminum alloy and a copper member composed of copper or a copper alloy.

In addition, the present embodiment has been explained such that the aluminum plate and the copper plate are pressed in a lamination direction by using a pressure device shown in FIG. 13. However, it is not limited thereto, and the aluminum plate and the copper plate can be pressed by other devices.

EXAMPLES

Hereinafter, the results of the confirmation experiment which was performed to confirm the effects of the present invention are explained.
(Manufacturing of Samples)

As an example of the present invention, a copper plate (having 2 mm×2 mm and 0.3 mm of thickness and) composed of an oxygen-free copper was bonded by solid phase diffusion bonding to a surface of an aluminum plate (having 10 mm×10 mm and 0.6 mm of thickness and) having a purity of 99.99% by the method described in the above embodiment. At this time, the aluminum plate and the copper plate were pressurized in a lamination direction at a pressure of 12 kgf/cm$^2$ and were heated at a temperature of 540° C. using a vacuum furnace. A heating time in the vacuum furnace was a retention time described in Table 1.

In addition, as a conventional example, a clad metal made by hot-rolling of an Al plate and a Cu plate was prepared.
(Observation of Cross-Sectional Surface of Samples)

A cross-sectional surface of each of the obtained lamination plates was observed after ion etching with conditions of an ion accelerating voltage: 5 kV; a processing time: 14 hours; and a projection amount from a masking shield: 100 μm, by using a cross-section polisher (SM-09010 produced by JEOL Ltd.), and the average crystal grain size of the copper plate and the aluminum plate in the area in the vicinity of the bonding interface was measured. In addition, the measurement of the average crystal grain size was carried out so as to comply with the cutting method described in JIS H 0501.
(Measuring Method of Oxides)

Each of the cross-sectional surfaces, which were ion etched with conditions of the ion accelerating voltage: 5 kV; the processing time: 14 hours; and the projection amount from a masking shield: 100 μm by using the cross-section polisher (SM-09010 produced by JEOL Ltd.), was photographed to obtain an In-Lens image by a Scanning electron microscope (ULTRA55 produced by Carl Zeiss NTS GmbH) with an accelerating voltage: 1 kV; and a WD: 2.5 mm, and a white contrast dispersed in a layered form along the interface between Cu and the intermetallic compound layer was obtained. Also, when an ESB image was photographed under the same conditions, the portion (white contrast portion) had become a dark contrast than Al. Furthermore, oxygen had been enrichment at the portion according to EDS analysis. According to the above, it was confirmed that in the interface between Cu and an intermetallic compound layer, oxides are dispersed in a layered form along the interface.

The sample in which oxide can be confirmed from the above method was recorded as "Present" in Table 1, and the sample in which oxide cannot be confirmed was recorded as "None".

(Shear Test)

A shear test was carried out using the sample. In addition, the shear test was carried out so as to comply with the standard of the International Electrotechnical Commission IEC 60749-19.

(Thermal Cycle Test)

In addition, thermal cycle test was carried out using the samples of the Examples of the Present Invention and the Conventional Example. The samples of the Examples of the Present Invention were made with the same production method of the sample described above, and the samples having a size of 40 mm×40 mm were used, and the clad metal having a size of 40 mm×40 mm was used as the Conventional Example. A junction rate after thermal cycle load was calculated from the expression below by using the samples after 4000 times of thermal cycle (from −45° C. to 200° C.) were carried out repeatedly. Here, an initial bonding area is defined as an area on which bonding will be performed, in other words, as an area of the sample in each of the present examples.

(Junction rate)={(Initial bonding area)−(Peeled off area)}/(Initial bonding area)

The evaluation results are shown in Table 1.

TABLE 1

|  | Oxide | Retention Time (min) | Average Crystal Grain Size (μm) | | Shear Test | | Junction Rate after Thermal Cycle Test (%) |
|---|---|---|---|---|---|---|---|
|  |  |  | Aluminum member | Copper member | Broken load (Mpa) | Broken surface |  |
| Example 1 of Present Invention | Present | 200 | 980 | 180 | 95.5 | Aluminum | 94.2 |
| Example 2 of Present Invention | Present | 150 | 970 | 140 | 87.6 | Aluminum | 93.9 |
| Example 3 of Present Invention | Present | 90 | 720 | 130 | 85.8 | Aluminum | 89.7 |
| Example 4 of Present Invention | Present | 60 | 540 | 80 | 85.0 | Aluminum | 84.2 |
| Example 5 of Present Invention | Present | 30 | 520 | 60 | 83.7 | Aluminum | 85.5 |
| Conventional Example | None | — | <15 | <15 | 47.8 | Interface between Aluminum/Copper | 73.6 |

In the Examples of the present invention, the intermetallic compound layer in which the plurality of intermetallic compounds is laminated in the bonding interface was observed in all the observed samples, and the observation showed that oxide is dispersed in the interface between the copper member and the intermetallic compound layer so as to arrange along the interface.

On the other hand, in the Conventional Example, oxide was not dispersed along the interface between the copper member and the intermetallic compound layer. Furthermore, the copper plate and the aluminum plate had a processed configuration formed by rolling, and the average crystal grain size was very fine.

In addition, in all the observed samples of the Examples of the Present Invention, a part of the aluminum plate was broken, and it was confirmed that shear strength of the bonding portion is high than the aluminum plate (base metal).

FIELD OF INDUSTRIAL APPLICATION

The present invention can provide a bonding structure of an aluminum member and a copper member in which the aluminum member made of aluminum or an aluminum alloy and the copper member made of copper or a copper alloy are bonded together relatively easily and reliably, the bonding structure thereof has sufficient bonding reliability and can apply to electrical and electronic parts and heat radiation parts, and a production method thereof.

DESCRIPTION OF REFERENCE SIGNS

11, 111, 211: Aluminum plate (Aluminum member)
12, 130, 212, 312: Copper plate (Cupper member)
20, 220: Bonding portion (bonding structure of aluminum member and copper member)
21, 321: Intermetallic compound layer
22, 222: θ phase
23, 223: η2 phase
24, 224, 324: ζ2 phase
27, 327: oxide
325: δ phase
326: γ2 phase

What is claimed is:
1. A bonding structure comprising:
an aluminum member composed of aluminum or an aluminum alloy;
a copper member composed of copper or a copper alloy;
an intermetallic compound layer that is made of copper and aluminum and is formed in a bonding interface between the aluminum member and the copper member; and
an oxide dispersed in an interface between the copper member and the intermetallic compound layer in a layered form along the interface,
wherein
the aluminum member and the copper member are bonded together by solid phase diffusion bonding,
wherein the intermetallic compound layer has a structure in which a plurality of intermetallic compounds is laminated along the bonding interface,
wherein the intermetallic compound layer has a structure in which a θ phase, a η2 phase, and at least one phase selected from a group consisting of a ζ2 phase, an δ phase, and a γ2 phase are laminated,
wherein the θ phase, the η2 phase, and the at least one phase selected from the group consisting of the ζ2 phase, the δ phase, and the γ2 phase are laminated sequentially from the aluminum member toward the copper member, wherein an average crystal grain size of the copper member is in a range of 80 μm to 180 μm in the vicinity of the bonding interface, and wherein an average crystal grain size of the aluminum member is 500 μm or more in the vicinity of the bonding interface.

2. The bonding structure according to claim 1, wherein the oxide is dispersed in a state of being divided in the interface between the copper member and the intermetallic compound layer, and the copper member and the intermetallic compound layer are partially in contact with each other.

3. The bonding structure according to claim 1, wherein an oxide is dispersed in a layered form inside a layer configured of the at least one phase selected from the group consisting of the ζ2 phase, the δ phase, and the γ2 phase.

* * * * *